US012718880B2

(12) United States Patent
Lecoq et al.

(10) Patent No.: US 12,718,880 B2
(45) Date of Patent: Aug. 25, 2026

(54) MEMORY DEVICE OF THE PHASE-CHANGE TYPE AND METHOD FOR READING SUCH A DEVICE

(71) Applicant: STMicroelectronics International N.V., Geneva (CH)

(72) Inventors: Xavier Lecoq, Voiron (FR); Alin Razafindraibe, Saint Martin d'Heres (FR); Christophe Forel, Saint-Egreve (FR)

(73) Assignee: STMicroelectronics International N.V., Geneva (CH)

( * ) Notice: Subject to any disclaimer, the term of this patent is extended or adjusted under 35 U.S.C. 154(b) by 78 days.

(21) Appl. No.: 18/660,938

(22) Filed: May 10, 2024

(65) Prior Publication Data

US 2024/0386955 A1 Nov. 21, 2024

(30) Foreign Application Priority Data

May 19, 2023 (FR) ....................................... 2304986

(51) Int. Cl.
*G11C 11/00* (2006.01)
*G11C 13/00* (2006.01)

(52) U.S. Cl.
CPC ........ *G11C 13/004* (2013.01); *G11C 13/0004* (2013.01); *G11C 13/0064* (2013.01); *G11C 2013/0054* (2013.01)

(58) Field of Classification Search
CPC .............. G11C 13/004; G11C 13/0004; G11C 13/0064; G11C 2013/0054; G11C 2013/0045; G11C 16/105; G11C 16/12
USPC .......................................................... 365/148
See application file for complete search history.

(56) References Cited

U.S. PATENT DOCUMENTS

| | | | | |
|---|---|---|---|---|
| 8,130,539 | B2 * | 3/2012 | Yoon .................. | G11C 13/0061 365/207 |
| 2002/0196664 | A1 | 12/2002 | Pasotti et al. | |
| 2004/0257854 | A1 | 12/2004 | Chen et al. | |
| 2005/0276138 | A1 | 12/2005 | Inoue | |
| 2008/0170444 | A1 | 7/2008 | Hoenigschmid | |
| 2008/0316803 | A1 | 12/2008 | Lin et al. | |
| 2009/0168493 | A1 | 7/2009 | Kim et al. | |

(Continued)

FOREIGN PATENT DOCUMENTS

EP 2052390 B1 6/2015

OTHER PUBLICATIONS

INPI Search Report and Written Opinion for priority application, FR Appl. No. 2304986, report dated Dec. 13, 2023, 8 pgs.

(Continued)

*Primary Examiner* — Tha-O H Bui
(74) *Attorney, Agent, or Firm* — Crowe & Dunlevy LLC

(57) ABSTRACT

A phase-change memory cell to be read is associated with a phase-change reference memory cell placed in a SET state. The reference memory cell has a structure that is identical to that of the memory cell. A first voltage is applied to the memory cell to cause output of a first current. A second voltage is applied to the reference memory cell to cause output of a second current. A sense amplifier is coupled to the memory cell and to the reference memory cell and is configured to compare respective values of the first current and of the second current and generate output information representative of the logic value of the datum stored by the memory cell.

18 Claims, 4 Drawing Sheets

(56) References Cited

U.S. PATENT DOCUMENTS

| | | | |
|---|---|---|---|
| 2014/0153326 | A1 | 6/2014 | Wang et al. |
| 2021/0035638 | A1 | 2/2021 | Vianello et al. |

OTHER PUBLICATIONS

Calligaro C et al: "Dichotomie Current-Mode Serial Sensing Methodology for Multistorage Non-Volatile Memories," Circuits and Systems Proceedings, Proceedings of the 38th Mid West Symposium on Rio De Janeiro, Brazil Aug. 13-16, 1995, New York, NY, USA, IEEE, US, vol. 1 (Aug. 13, 1995) pp. 302-305, XP010165128.

* cited by examiner

MEMORY DEVICE OF THE PHASE-CHANGE TYPE AND METHOD FOR READING SUCH A DEVICE

PRIORITY CLAIM

This application claims the priority benefit of French Application for Patent No. 2304986, filed on May 19, 2023, the content of which is hereby incorporated by reference in its entirety to the maximum extent allowable by law.

TECHNICAL FIELD

The invention relates to non-volatile memories and, more specifically, to phase-change memories (PCM) and to the reading of such memories.

BACKGROUND

Phase-change memories are non-volatile memories that rely on the properties of phase-change materials.

More specifically, a phase-change material is able to switch from a low-resistance state to a high-resistance state under heating.

Phase-change memories take advantage of the fact that the electric resistances of the different states of the phase-change materials are different in order to store data.

More specifically, the phase-change material is able to switch from a High-Resistance State (HRS) to a Low-Resistance State (LRS) under the effect of heat and the Joule effect generated by the application of a current between electrodes.

Switching from a high-resistance state to a low-resistance state corresponds to a programming or activation operation referred to as "SET", i.e., an operation writing a binary datum value, for example a logic value 1. The memory is thus in a so-called "SET" state.

Switching from a low-resistance state to the high-resistance state corresponds to an erase or deactivation operation referred to as "RESET", i.e., an operation to write an opposite binary datum value, for example a logic value 0. The memory is thus in a so-called "RESET" state.

To carry out a programming or SET operation, the phase-change material is heated to between its crystallization and melting temperatures and then slowly cooled to obtain a crystalline phase. The current pulse thus decays slowly.

However, in order to make the phase-change material amorphous (the erase or RESET operation), it is heated above its melting temperature and then rapidly cooled to set it in the amorphous state at room temperature. The current pulse is thus very short and abrupt.

The read current of a phase-change memory is highly variable and depends on: a) the memory manufacturing process (P: Process); b) the temperature (T); c) the voltage drops (V) on the word lines; d) the cycling and ageing of the memory; e) the capacitive resistive losses on the interconnection paths between the various memory elements; and finally f) the voltage drops (V) on the bit lines.

To compensate for these variations in read current associated with points a), b), c), d) and f) above, reading is carried out in a so-called "single-ended mode" by comparing the current drawn by the memory cell with a current source and by using very relaxed settings to check the programming and erase results.

However, such a solution is sensitive to memory resistance drifts and structural offsets observed between a memory cell and a current source.

Another prior art solution consists of reading in differential mode between the memory cell and a complementary memory cell (i.e., storing a logical datum that is the opposite of the datum stored in the memory cell) so as to obtain fast readings under all Process, Voltage, Temperature (PVT) conditions with large current differences.

However, such a solution is very costly in terms of its surface area on silicon, since all of the memory cells are "doubled" due to the presence of the complementary memory cells.

There is thus a need to offer a solution for reading a phase-change memory that is reliable, regardless of the PVT conditions.

There is also a need to offer a solution that is also economical in terms of its surface area on silicon.

SUMMARY

According to one embodiment, the memory cell is read in a single-ended mode and use, instead of the current source of the prior art, a reference memory cell that is structurally identical to the memory cell to be read, and that is placed in a SET state.

According to another embodiment, a reference memory cell is associated with each group of a plurality of memory cells to be read, which offers appreciable space savings on silicon.

According to one aspect, an embodiment is a memory device of the phase-change type (PCM).

This memory device comprises (minimally): a phase-change memory cell configured to have a SET state and a RESET state corresponding respectively to two logic values of a datum stored in the memory cell and to two corresponding reference values of currents (for example a reference value of less than 1 microampere and a reference value in the order of 16 microamperes) output by the memory cell; and a phase-change reference memory cell placed in a SET state, the reference memory cell being placed next to the memory cell and having a structure that is identical to that of the memory cell; a read circuit configured to read the stored datum and including: a first circuit configured to apply a first voltage to the memory cell and to cause a first current to be output by the memory cell; a second circuit configured to apply a second voltage to the reference memory cell and to cause a second current to be output by the reference memory cell, the value whereof lies between said two reference values; and a sense amplifier having a first input coupled to the memory cell and a second input coupled to the reference memory cell and configured to output information representative of the logic value of the datum depending on the respective values of the first current and of the second current.

This reading in single-ended mode and using such a reference memory cell is more precise than the conventional single-ended reading method that uses a current source because: it is less sensitive to the resistance offset of the PCM memory cell and to the structural offsets observed between a PCM memory cell and a current source, and the read currents of the memory cell and of the reference memory cell have less variability with respect to temperature and voltage.

According to one embodiment, the value of the second current is equal to half the difference between the two reference values.

According to one embodiment, the distance between the memory cell and the reference memory cell is between 10 micrometers and 20 micrometers.

According to one embodiment, the device further comprises a refresh circuit configured to regularly return the reference memory cell to its SET state.

According to one embodiment, the refresh circuit comprises a current generator configured to output a current pulse to the reference memory cell so as to place it in its SET state and a verification circuit configured to verify the SET state of the reference memory cell including the sense amplifier.

In practice, the memory map of the memory device includes a plurality of memory cells.

In such a case and according to one embodiment, the device comprises at least one group of a plurality of memory cells associated with the reference memory cell, respectively coupled to the first input of the sense amplifier via controllable switches, and a control circuit configured to successively select said switches so that the read circuit can successively read each memory cell of said at least one group.

For example, the device includes at least one group of N memory cells, where N is an even number, divided into two sub-groups of N/2 memory cells, and one reference memory cell per group bordered by the two sub-groups of memory cells.

According to another aspect, a method is presented for reading a memory device of the phase-change type, the device comprising a phase-change memory cell configured to have a SET state and a RESET state corresponding respectively to two logic values of a datum stored in the memory cell and to two corresponding reference values of currents output by the memory cell. The method comprises: placing a phase-change reference memory cell in a SET state next to the memory cell, the structure of which phase-change reference memory cell is identical to that of the memory cell; applying a first voltage to the memory cell in order to cause it to output a first current; applying a second voltage to the reference memory cell in order to cause it to output a second current, the value whereof lies between said two reference values; comparing the value of the first current to the value of the second current and outputting information representing the logic value of the datum according to the respective values of the first current and of the second current.

According to one implementation, the value of the second current is equal to half the difference between the two reference values.

According to one implementation, the reference memory cell is placed at a distance of between 10 micrometers and 20 micrometers from the memory cell.

According to one implementation, the method further comprises regularly refreshing the reference memory cell to return it to its SET state.

According to one implementation, refreshing comprises outputting a current pulse to the reference memory cell so as to place it in its SET state and verifying the SET state of the reference memory cell.

According to one implementation, a reference memory cell is associated with a plurality of memory cells and each memory cell is read successively using the reference memory cell.

According to one implementation, a reference memory cell is associated with a group of N memory cells, where N is an even number, divided into two sub-groups of N/2 memory cells, and the reference memory cell is placed between the two sub-groups of memory cells.

BRIEF DESCRIPTION OF THE DRAWINGS

Other advantages and features of the invention will become apparent upon examining the detailed description of non-limiting embodiments and implementations of the invention, and from the accompanying drawings in which.

DETAILED DESCRIPTION

Figure 1:
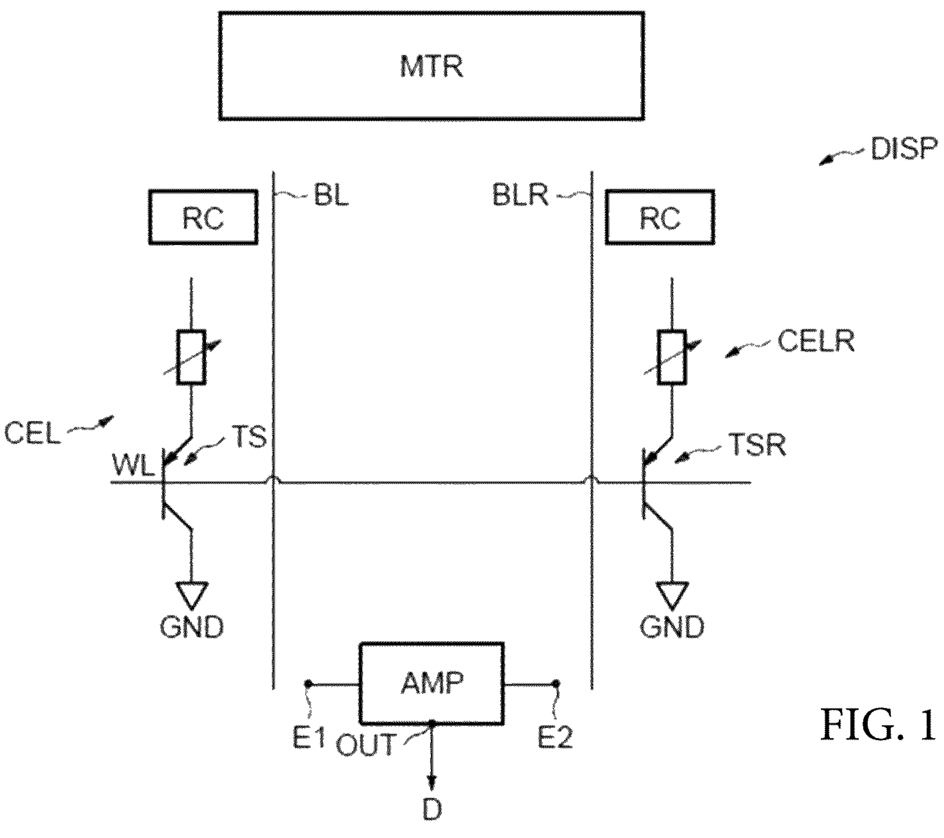
FIG. 1 shows a memory device of the phase-change type.

In FIG. 1, the reference DISP denotes a memory device of the phase-change type comprising, in this case, a phase-change memory cell CEL and a phase-change reference memory cell CELR.

The memory cell CEL and the reference memory cell CELR have an identical structure and are placed side by side.

The structure of a phase-change memory cell is conventional and known per se.

More specifically, it includes a memory element, for example containing germanium, antimony and tellurium, which has different resistance values depending on the RESET/SET state of the memory.

This memory element is associated with a heating device, for example two electrodes, which, when a current flows therethrough, heats the memory element by Joule effect to vary the resistance thereof.

The memory cell CEL is associated with a selection transistor TS, in this case a bipolar PNP transistor connected in series between the memory element and a neutral supply point, typically the ground GND.

The base of the bipolar transistor is connected to a word line WL and is intended to receive a voltage switching this transistor on so as to allow current to flow through the heating device in order to heat the memory element.

The base of the bipolar selection transistor TSR associated with the reference memory cell CELR is also connected to the word line WL.

It goes without saying that the bipolar transistors TS and TSR could be replaced by MOS transistors, for example by PMOS transistors.

A memory cell CEL in a SET state is intended to output a first read current in the order, for example, of 16 microamperes.

A memory cell CEL in its RESET state is capable of outputting a first current of, for example, less than one microampere.

These currents are obtained in the presence of a voltage applied to the memory element of between 1.5 and 1.8 volts for a bipolar selection transistor TS and between 0.4 and 0.5 volts for a selection transistor of the MOS type.

The memory device DISP further includes a bit line BL associated with the memory cell CEL and a bit line BLR associated with the reference memory cell CELR.

The reference RC denotes the stray resistances and capacitances resulting from interconnections between the various elements of the device DISP.

The device DISP further includes a sense amplifier AMP, of conventional structure and known per se, having a first input E1 and a second input E2 intended to receive two currents when the memory cell CEL is read and to output, at the output terminal OUT, information representing a datum D having either the logic value 0 or the logic value 1.

Finally, the device DISP includes a processing circuit MTR incorporating a reading circuit and a refreshing circuit, which will be discussed in more detail hereinbelow.

The interconnections between the various elements illustrated in FIG. 1 have deliberately not been shown to avoid complicating FIG. 1. More specifically, depending on the different configurations (reading of the memory cell CEL, refreshing of the reference memory cell CELR), the connections between at least some of these elements differ.

These connections are shown in the following figures according to the operation envisaged.

Figure 2:
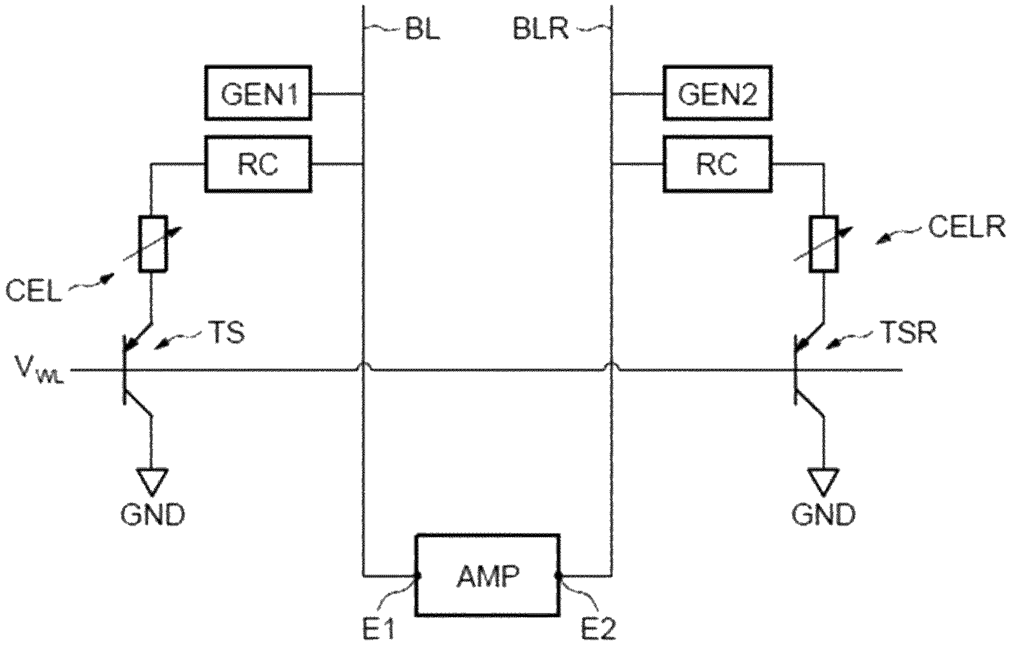
FIG. 2 and FIG. 3 illustrate an implementation of a method for reading the memory cell.
Figure 3:
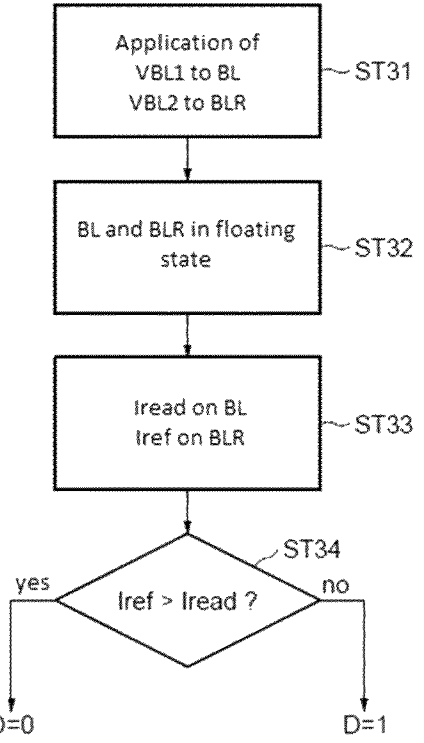

Reference is now made more particularly to FIG. 2 and FIG. 3 to describe one implementation of a method for reading the memory cell CEL.

The processing circuit MTR in FIG. 1 in this case comprises a reading circuit including a first voltage generator GEN1 and a second voltage generator GEN2 intended to be respectively connected to the bit lines BL and BLR.

Moreover, the bit lines BL and BLR are respectively connected to the two inputs E1 and E2 of the sense amplifier AMP.

The memory cell CEL is connected to the bit line BL, whereas the reference cell CELR is connected to the bit line BLR.

The reference cell CELR is placed in its SET state, for example after the memory device has been manufactured.

The method for reading the cell CEL is described with reference to FIG. 3.

In a step ST31, a voltage VBL1 is applied to the bit line BL and a voltage VBL2 is applied to the bit line BLR.

These two voltages VBL1 and VBL2 are respectively output by the two voltage generators GEN1 and GEN2.

The voltage VBL1 is that producing a current corresponding to the SET state of the memory cell CEL (typically, for example, 16 microamperes).

For a bipolar selection transistor, a voltage VBL1 of between 1.5V and 1.8V will be selected.

The voltage VBL2 is lower than the voltage VBL1, in order to output, to the reference memory cell CELR, a reference current that lies between a read current (typically less than or equal, for example, to 1 microampere) corresponding to the RESET state of the memory cell CEL and a read current (typically in the order of, for example, 16 microamperes) corresponding to the SET state of the memory cell CEL.

For example, a reference current value equal to half the difference between the two aforementioned currents will be taken, for example 8 microamperes, and in this case, the voltage VBL2 could typically be in the order of 100 to 200 millivolts less than the voltage VBL1.

It goes without saying that this range from 100 to 200 millivolts is only an example and that a person skilled in the art will know how to adjust these values depending on the read current, the type of selection transistor and the stray resistance/capacitance features of the interconnections between the various elements of the device DISP.

Once the bit lines BL and BLR have been biased with voltages VBL1 and VBL2 in step ST31, the bit lines BL and BLR are set to a floating state (step ST32), for example by disconnecting the two generators GEN1 and GEN2 from the bit lines BL and BLR or by stopping voltage output from the generators.

As the transistors TS and TSR are on, the memory cell CEL draws a first current Iread flowing on the bit line BL, whereas the reference memory cell CELR draws a second current Iref flowing on the bit line BLR (step ST33).

These two currents Iref and Iread are compared (step ST34) in the sense amplifier AMP.

If the current Iref is greater than the current Iread, then the datum stored in the memory cell CEL corresponds to a logic value of 0 (RESET state of the cell CEL).

If the current Iread is greater than the current Iref, then the datum stored in the memory cell CEL corresponds to a logic value of 1 (SET state of the cell CEL).

This reading in single-ended mode is more precise than the conventional single-ended reading method using a current source, because it is less sensitive to the resistance offset of the PCM memory cell and to the structural offsets observed between a memory cell and a current source.

Moreover, the fact that the memory cell CEL and the reference memory cell are placed side by side ensures that the voltages applied to the bases of the selection transistors TS and TSR are substantially the same and that the read paths of the memory cell CEL and the read paths of the reference memory cell CELR are correctly balanced.

For information, a distance of between 10 micrometers and 20 micrometers between the memory cell CEL and the reference memory cell CELR in the side-by-side arrangement can advantageously be selected for 18-nanometer technology.

It goes without saying that this distance value is only an example and that a person skilled in the art will be able to adjust this value, where necessary, depending in particular on the features of the memory cells, of the read schemas and more generally of the application considered.

In some cases, the reference memory cell can gradually lose its SET state.

It is thus advantageous, in certain applications, to be able to refresh this reference memory cell in order to regularly return it to its SET state.

The refresh rate depends on the application envisaged.

Figure 4:
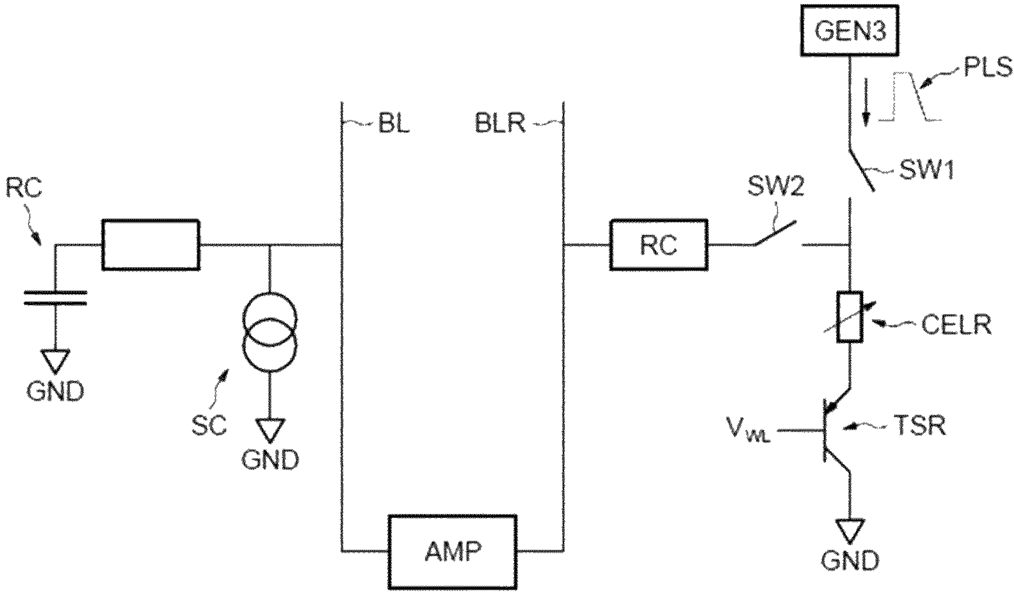
FIG. 4 shows a refresh circuit configured to regularly return the reference memory cell to its SET state.

In this respect, reference will now be made more particularly to FIG. 4, showing the device further including a refreshing circuit configured to regularly return the reference memory cell CELR to its SET state.

The refreshing circuit comprises, in this case, a current generator GEN3 configured to output a current pulse PLS (programming pulse) to the reference memory cell CELR so as to place it in its SET state, and circuit for verifying the SET state of the reference memory cell, the verification circuit including, in this case, a current source SC and the sense amplifier AMP.

A first switch SW1, for example a MOS transistor, is connected between the generator GEN3 and the reference memory cell CELR.

A second switch SW2, for example a MOS transistor, is connected between the memory cell CELR and the bit line BLR.

Again, in FIG. 4, the reference RC denotes the stray resistances and capacitances of the interconnections.

Figure 5:
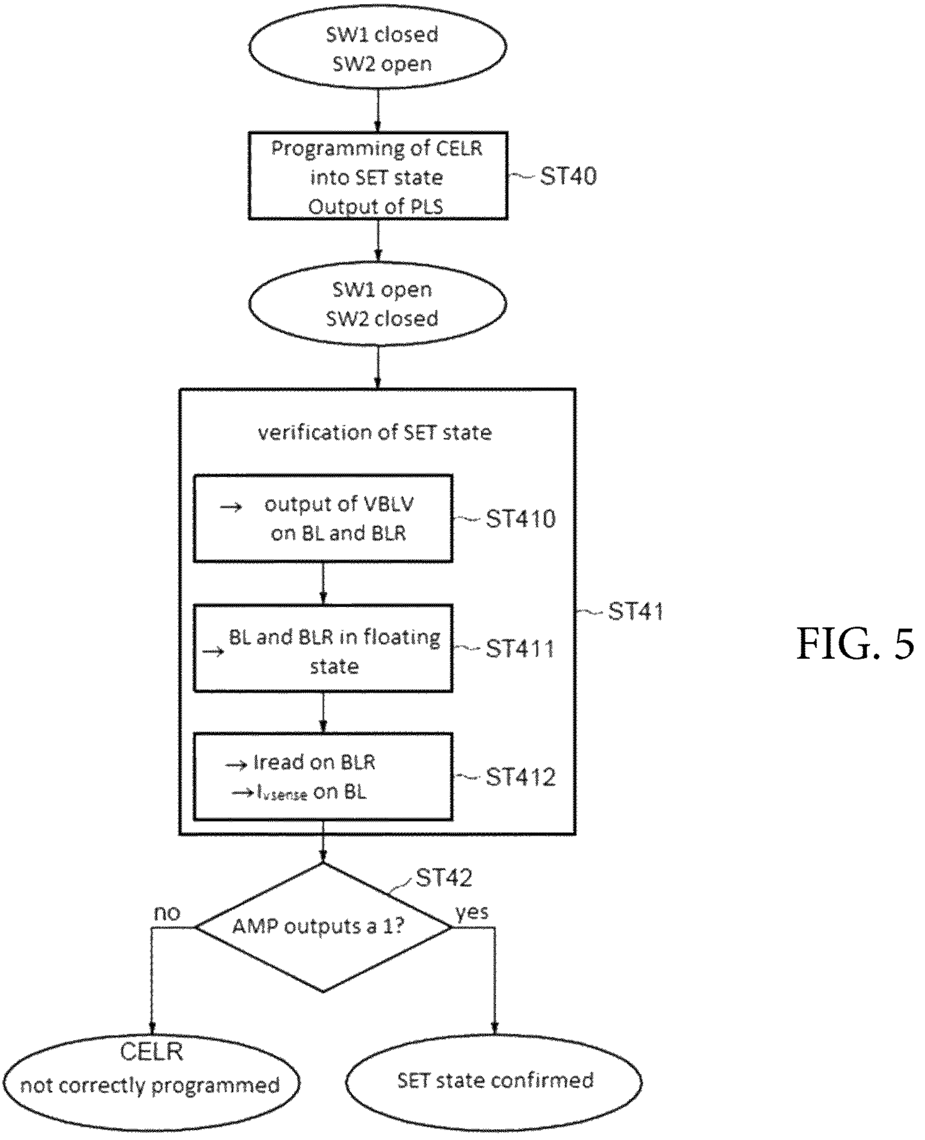
FIG. 5 shows the process for refreshing the reference memory cell to its SET state.

Reference will now be made more particularly to FIG. 5 to describe refreshing the reference memory cell CELR in its SET state.

Initially, the switch SW1 is closed and the switch SW2 is open. As a result, the generator GEN3 is connected to the reference memory cell CELR and the sense amplifier AMP is not.

In step ST40, the memory cell CELR is programmed so as to place it in its SET state.

In this respect, the pulse PLS is output in a conventional form in which it is adapted to place a memory cell of the PCM type in its SET state.

Then, the switch SW1 is opened and the switch SW2 is closed so as to verify the SET state of the reference memory cell CELR in step ST41.

In this respect, in step ST410, the same voltage VBLV is output on the bit lines BL and BLR, for example using the generators GEN1 and GEN2 in FIG. 2, or using another single generator.

This voltage VBLV is chosen so as to emulate a current of, for example, 16 microamperes corresponding to the SET state of a memory cell.

The bit lines BL and BLR are then set to a floating state (step ST411).

The current source SC thus draws a current $I_{vsense}$ on the bit line BL, whereas the reference memory cell CELR draws a current Iread on the bit line BLR (step ST412).

The two currents are compared in the sense amplifier AMP (step ST42).

If the amplifier AMP does not output a logic value of 1, this means that the memory cell CELR has not been correctly programmed to the SET state.

Conversely, the SET state is confirmed.

It goes without saying that the current source SC can vary depending on the temperature.

This can be procured by using a current source of the type that is proportional to absolute temperature (PTAT) or a current source that is controlled by a temperature sensor.

Typically, the memory device comprises a memory map having a matrix of memory cells CEL organized into rows and columns.

Figure 6:
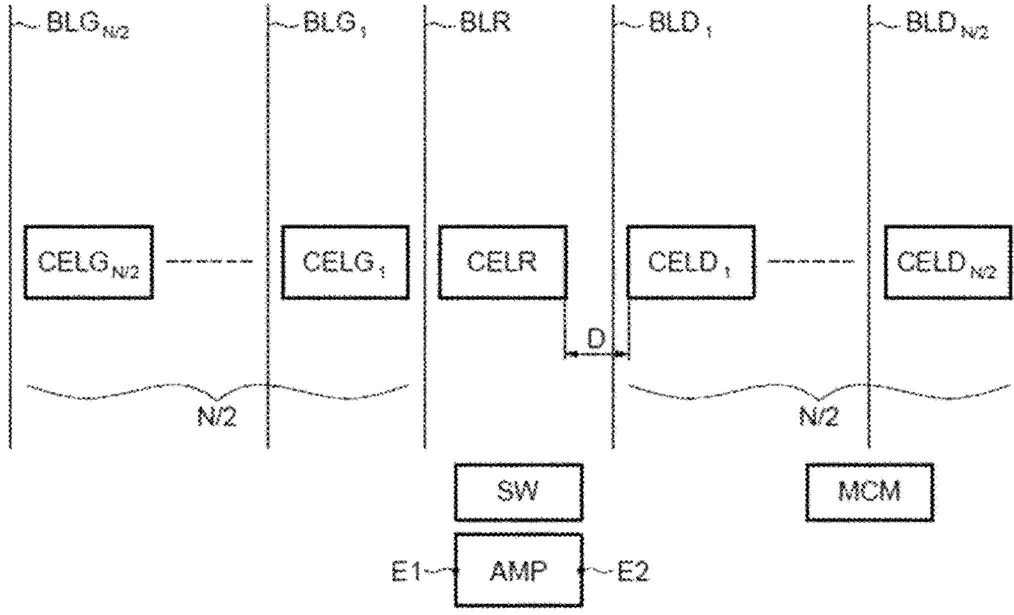
FIG. 6 illustrates a single group of a plurality of memory cells.

Thus, as illustrated in FIG. 6, a row of memory cells includes groups of a plurality of memory cells.

For simplification purposes, FIG. 6 illustrates a single group of a plurality of memory cells $CELG_i$ and $CELD_i$ respectively coupled to the first input E1 of the sense amplifier AMP via controllable switches SW.

A single reference memory cell CELR is associated with this group of memory cells CEL.

Moreover, this reference memory cell is connected to the second input E2 of the sense amplifier as described hereinabove.

Control circuit MCM, for example a logic circuit, are thus configured to successively select said switches SW so that the reading circuit can successively read each memory cell CEL as explained hereinabove.

In practice, groups of N memory cells associated with a single reference memory cell CELR could be selected for example.

Moreover, so as not to distance the memory cells in this group too far from the reference memory cell, a number N of memory cells is selected, and the memory cells are divided into two sub-groups of N/2 memory cells.

Moreover, as illustrated in FIG. 6, the reference memory cell CELR is bordered by a first sub-group of N/2 memory cells $CELG_i$-$CELG_{N/2}$ and by a second group of N/2 memory cells $CELD_1$-$CELD_{N/2}$.

The distance D between each memory cell $CELG_i$-$CELD_1$ immediately adjacent to the reference memory cell is, as indicated hereinabove, preferably in the order of 10 to 20 microns.

Moreover, a person skilled in the art will select the value of N/2 so that the memory cells $CELG_{N/2}$-$CELD_{N/2}$ located the furthest from the reference cell are not excessively impacted by a too great distance relative to the reference memory cell CELR.

For example, groups of 8 memory cells can be selected on each row of the memory map.

Each group is thus associated with a reference cell bordered on the left and right by 4 memory cells.

Figure 7:
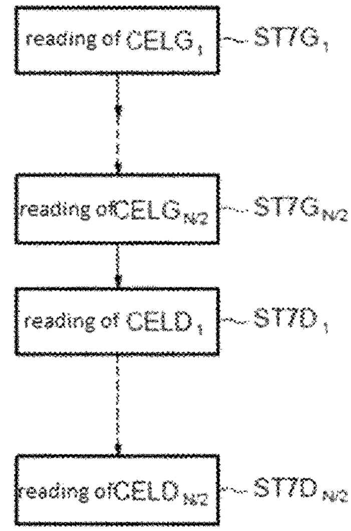
FIG. 7 illustrates a process for successively reading memory cells.

Moreover, as illustrated in FIG. 7, in a step ST7G1, the first cell on the left $CELG_1$ is firstly read (step ST7G1), then the other cells on the left are successively read until the cell $CELG_{N/2}$ is read (step ST7$G_{N/2}$).

Subsequently, the first cell on the right $CELD_1$ is read (step ST7$D_1$), then the other cells on the right are successively read until the cell $CELD_{N/2}$ is read in step ST7$D_{N/2}$.

It goes without saying that any other reading order is possible.

The invention claimed is:

1. A memory device of the phase-change type, comprising:

a phase-change memory cell configurable into having a SET state and a RESET state which correspond, respectively, to first and second logic values of a datum stored in the memory cell and to first and second corresponding values of current output by the phase-change memory cell;

a phase-change reference memory cell placed in the SET state, wherein the phase-change reference memory cell has a structure that is identical to the phase-change memory cell; and a circuit configured to read the stored datum, the circuit including:

a first voltage generator circuit that applies a first voltage to a first bit line coupled to the phase-change memory cell, wherein the phase-change memory cell generates a first current on the first bit line;

a second voltage generator circuit that applies a second voltage, different from the first voltage, to a second bit line coupled to the phase-change reference memory cell, wherein the phase-change reference memory cell in the SET state generates to a second current on the second bit line having a value that lies between said first and second corresponding values of current; and a sense amplifier having a first input coupled to the first bit line and a second input coupled to the second bit line cell and configured to output information representative of the logic value of the datum depending on a comparison of the first current and the second current.

2. The device according to claim 1, wherein the value of the second current is equal to half the difference between said first and second corresponding values of current.

3. The device according to claim 1, wherein the phase-change reference memory cell is placed next to the phase-change memory cell.

4. The device according to claim 3, wherein a distance between the phase-change memory cell and the phase-change reference memory cell is between 10 micrometers and 20 micrometers.

5. The device according to claim 1, further comprising a refreshing circuit configured to regularly return the phase-change reference memory cell to said SET state.

6. The device according to claim 5, wherein the refreshing circuit comprises:

a current generator configured to output a current pulse to the phase-change reference memory cell which places the phase-change reference memory cell in said SET state; and a circuit for verifying the SET state of the phase-change reference memory cell including the sense amplifier.

7. The device according to claim 1, wherein a plurality of phase-change memory cells are respectively coupled to the first bit line and the first input of the sense amplifier via controllable switches, and further comprising a control circuit configured to successively select said controllable switches so that the circuit configured to read can successively read each phase-change memory cell.

8. The device according to claim 7, further including at least one group of N phase-change memory cells, where N is an even number, divided into two sub-groups of N/2 phase-change memory cells, and one phase-change reference memory cell per group is bordered by the two sub-groups of phase-change memory cells.

9. A method for reading a memory device of phase-change type that includes a phase-change memory cell configurable into having a SET state and a RESET state which correspond, respectively, to first and second logic values of a datum stored in the memory cell and to first and second corresponding values of current output by the phase-change memory cell, the method comprising:

placing a phase-change reference memory cell in the SET state, wherein the phase-change reference memory cell has a structure that is identical to the phase-change memory cell;

applying a first voltage to a first bit line coupled to the phase-change memory cell;

generating by the phase-change memory cell a first current on the first bit line;

applying a second voltage, different from the first voltage, to a second bit line coupled to the phase-change reference memory cell;

generating by the phase-change reference memory cell in the SET state to a second current on the second bit line having a value that lies between said first and second corresponding values of current; and comparing the first current to the second current and outputting information representing the logic value of the datum depending on the first current and the second current.

10. The method according to claim 9, wherein a value of the second current is equal to half a difference between the first and second corresponding values of current.

11. The method according to claim 9, further comprising placing the phase-change reference memory cell next to the phase-change memory cell spaced from the phase-change memory cell by a distance of between 10 micrometers and 20 micrometers.

12. The method according to claim 9, further comprising regularly refreshing the phase-change reference memory cell to return to the SET state.

13. The method according to claim 12, wherein regularly refreshing comprises:

outputting a current pulse to the phase-change reference memory cell so as to place it in the SET state; and verifying the SET state of the phase-change reference memory cell.

14. The method according to claim 9, wherein the phase-change reference memory cell is associated with a plurality of phase-change memory cells and each phase-change memory cell is read successively using the phase-change reference memory cell.

15. The method according to claim 9, wherein the phase-change reference memory cell is associated with a group of N phase-change memory cells, where N is an even number, divided into two sub-groups of N/2 phase-change memory cells, and the phase-change reference memory cell is placed between the two sub-groups of phase-change memory cells.

16. A memory device, comprising:

a phase-change memory cell coupled to a first bit line;

wherein the phase-change memory cell is programmable to store a datum;

a phase-change reference memory cell coupled to a second bit line and having a structure that is identical to the phase-change memory cell;

wherein the phase-change reference memory cell is programmed into a SET state;

a first voltage generator that applies a first voltage to the first bit line;

a second voltage generator that applies a second voltage, different from the first voltage, to the second bit line;

wherein a level of the second voltage is less than a level of the first voltage; and a sense amplifier that compares a first current output by the phase-change memory cell on the first bit line in response to the first voltage to a second current output by the phase-change reference memory cell on the second bit line in response to the second voltage to generate an output indicative of the datum stored by the phase-change memory cell.

17. The device according to claim 16, further comprising a refreshing circuit configured to regularly return the phase-change reference memory cell to said SET state.

18. The device according to claim 17, wherein the refreshing circuit comprises:

a current generator configured to output a current pulse to the phase-change reference memory cell which places the phase-change reference memory cell in said SET state; and a circuit for verifying the SET state of the phase-change reference memory cell including the sense amplifier.

* * * * *